(12) United States Patent  
Kim et al.

(10) Patent No.: US 11,991,816 B2
(45) Date of Patent: May 21, 2024

(54) ELECTRONIC DEVICE INCLUDING HEAT DISSIPATION STRUCTURE

(71) Applicant: Samsung Electronics Co., Ltd., Gyeonggi-do (KR)

(72) Inventors: Yongyoun Kim, Gyeonggi-do (KR); Chanhee Oh, Gyeonggi-do (KR); Dongkee Jung, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 221 days.

(21) Appl. No.: 17/713,438

(22) Filed: Apr. 5, 2022

(65) Prior Publication Data

US 2022/0322516 A1 Oct. 6, 2022

Related U.S. Application Data

(63) Continuation of application No. PCT/KR2022/003258, filed on Mar. 8, 2022.

(30) Foreign Application Priority Data

Apr. 6, 2021 (KR) .................. 10-2021-0044838

(51) Int. Cl.
*G06F 1/16* (2006.01)
*H01Q 1/02* (2006.01)
(Continued)

(52) U.S. Cl.
CPC .......... *H05K 1/0203* (2013.01); *G06F 1/1698* (2013.01); *H01Q 1/02* (2013.01);
(Continued)

(58) Field of Classification Search
CPC .......... H01Q 1/243; H05K 2201/10098; G06F 1/1698; H04M 1/0277
See application file for complete search history.

(56) References Cited

U.S. PATENT DOCUMENTS 10,141,625 B1   11/2018   Ryu et al.
10,811,336 B2   10/2020   Pillarisetty et al.
(Continued)

FOREIGN PATENT DOCUMENTS

CN   103228118 A   7/2013
CN   106332518 B   11/2019
(Continued)

OTHER PUBLICATIONS

International Search Report dated Jun. 10, 2022.
Russian Office Action dated Nov. 16, 2023.

*Primary Examiner* — Adrian S Wilson
(74) *Attorney, Agent, or Firm* — Cha & Reiter, LLC

(57) ABSTRACT

According to various embodiments of the disclosure, an electronic device may include a housing, a non-conductive supporting member disposed in the housing and including a first area, a second area spaced apart from the first area, and a third area connecting the first area and the second area, a conductive pattern portion disposed over the first area of the supporting member, a heat dissipation member disposed to at least partially overlap the conductive pattern portion, and an antenna including a circuit board, a conductive portion, and a ground portion. The conductive portion of the antenna may be disposed over the second area. The heat dissipation member may extend from the first area to the third area, and the ground portion of the antenna may extend from the second area to the third area to contact at least a portion of the heat dissipation member.

20 Claims, 8 Drawing Sheets

(51) Int. Cl.
*H01Q 5/25* (2015.01)
*H01Q 9/04* (2006.01)
*H05K 1/02* (2006.01)
*H02J 50/20* (2016.01)

(52) U.S. Cl.
CPC ............ *H01Q 5/25* (2015.01); *H01Q 9/0407* (2013.01); *H02J 50/20* (2016.02); *H05K 2201/10098* (2013.01)

(56) References Cited

U.S. PATENT DOCUMENTS

| | | | |
|---|---|---|---|
| 11,101,564 B2* | 8/2021 | Oh | H01Q 1/38 |
| 2004/0077124 A1* | 4/2004 | Ogawa | H01L 23/66 |
| | | | 438/618 |
| 2011/0235278 A1* | 9/2011 | Hara | H05K 1/0203 |
| | | | 361/715 |
| 2013/0198501 A1 | 8/2013 | Wu | |
| 2015/0214598 A1* | 7/2015 | Fujita | H01Q 1/2283 |
| | | | 343/893 |
| 2017/0006738 A1 | 1/2017 | Lee et al. | |
| 2018/0048058 A1 | 2/2018 | Ehman et al. | |
| 2019/0006756 A1 | 1/2019 | Lee et al. | |
| 2020/0100390 A1 | 3/2020 | Koo et al. | |
| 2020/0178415 A1 | 6/2020 | Kim et al. | |
| 2020/0267828 A1 | 8/2020 | Moon et al. | |
| 2020/0313284 A1 | 10/2020 | Kim et al. | |
| 2021/0051797 A1 | 2/2021 | Han | |
| 2023/0110427 A1 | 4/2023 | Lee et al. | |
| 2023/0208013 A1* | 6/2023 | Lee | H01Q 1/243 |
| | | | 343/702 |
| 2023/0261680 A1* | 8/2023 | Lee | G06F 1/1637 |
| 2023/0318173 A1* | 10/2023 | Oh | H01Q 1/526 |
| | | | 343/841 |

FOREIGN PATENT DOCUMENTS

| | | |
|---|---|---|
| EP | 3 742 578 A2 | 11/2020 |
| JP | 6330149 B2 | 5/2018 |
| KR | 10-2016-0093127 A | 8/2016 |
| KR | 10-2017-0004068 A | 1/2017 |
| KR | 10-2019-0115968 A | 10/2019 |
| KR | 10-2020-0033652 A | 3/2020 |
| KR | 10-2020-0100973 A | 8/2020 |
| KR | 10-2020-0114150 A | 10/2020 |
| KR | 10-2021-0020450 A | 2/2021 |
| KR | 10-2021-0156661 A | 12/2021 |
| RU | 105 559 U1 | 6/2011 |
| WO | 2010/127725 A1 | 11/2010 |
| WO | WO2014/196144 A1 | 12/2014 |
| WO | 2020/241917 A1 | 12/2020 |

* cited by examiner

ELECTRONIC DEVICE INCLUDING HEAT DISSIPATION STRUCTURE

CROSS-REFERENCE TO RELATED APPLICATION(S)

This application is a Continuation of and claims priority under 35 U.S.C. § 120 to PCT International Application No. PCT/KR2022/003258, which was filed on Mar. 8, 2022, and claims priority to Korean Patent Application No. 10-2021-0044838, filed on Apr. 6, 2021, in the Korean Intellectual Property Office, the disclosure of which are incorporated by reference herein their entirety.

BACKGROUND

Technical Field

One or more embodiments of the instant disclosure generally relate to an electronic device including a heat dissipation structure.

Description of Related Art

Advancing information communication and semiconductor technologies accelerate the widespread use of various electronic devices. Electronic devices are being developed to carry out communication while being portable.

The term "electronic device" may refer to a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as sound or images. As electronic devices are highly integrated, and high-speed, high-volume wireless communication becomes commonplace, the electronic device, such as a mobile communication terminal, is being equipped with various functions. For example, the electronic device may come with various integrated functionalities, including entertainment function, such as video games, multimedia function, such as replaying music/videos, communication and security function for mobile banking, and scheduling or e-wallet function. Such electronic devices have become compact enough for users to carry in a convenient way.

Due to the recent demand for high integration and performance as well as for more compactness and slimness and application of state-of-the-art technology related to antennas for portable electronic devices, e.g., smartphones, excessive amount of heat may be generated and heat generation density may arise in the portable electronic device. Accordingly, a need exists for various heat diffusion structures to efficiently dissipate heat generated from heat sources inside the electronic device.

SUMMARY

In general, an electronic device may include a conductive pattern portion and a broadband antenna adjacent to the rear plate. Since the conductive pattern portion and the broadband antenna have different stack structures, they cannot be designed in a single manufacturing process. For example, as compared to the conductive pattern portion, the broadband antenna may be designed to have a relatively large thickness.

According to an embodiment, a printed circuit board (PCB) and various electronic components are disposed inside the electronic device. Some electric components mounted on the printed circuit board (PCB) generate electromagnetic waves and/or heat which may cause malfunction and performance deterioration of the electronic device. For example, when an electrical device (e.g., an application processor (AP)) generating an excessive amount of heat is disposed to overlap a portion of the broadband antenna, relatively high heat may be concentrated on the rear surface of the electronic device as compared to the front surface, and the performance of the electrical component may be reduced.

According to an embodiment of the disclosure, an electronic device may comprise a housing including a front plate and a rear plate, a non-conductive supporting member disposed in the housing to be adjacent to the rear plate, the supporting member including a first area, a second area spaced apart from the first area, and a third area connecting the first area and the second area, a conductive pattern portion disposed over the first area of the supporting member and configured to generate a magnetic field, a heat dissipation member disposed to at least partially overlap the conductive pattern portion, and an antenna including a circuit board, a conductive portion disposed on one surface of the circuit board, and a ground portion disposed on the other surface of the circuit board. The conductive portion of the antenna may be disposed in the second area. The heat dissipation member may extend from the first area to the third area, and the ground portion of the antenna may extend from the second area to the third area to contact at least a portion of the heat dissipation member.

According to an embodiment of the disclosure, an electronic device may comprise a housing including a plate, a supporting member disposed in the housing and including a first area, a second area spaced apart from the first area, and a third area connecting the first area and the second area, a conductive pattern portion disposed over the first area of the supporting member and configured to generate a magnetic field, an antenna disposed over the second area of the supporting member and including a circuit board and a patch-type conductive portion disposed on one surface of the circuit board, and a heat dissipation member including a first heat dissipation portion disposed under the conductive pattern portion, a second heat dissipation portion disposed under the antenna, and a third heat dissipation portion connecting the first heat dissipation portion and the second heat dissipation portion and positioned along the third area.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

According to certain embodiments of the disclosure, there may be provided an electronic device including a heat dissipation structure.

According to certain embodiments of the disclosure, when the heat dissipation member applied to the conductive pattern portion is in contact with the ground portion of the broadband antenna, it is possible to easily diffuse the heat generated from at least one electrical component disposed adjacent to the broadband antenna.

According to certain embodiments of the disclosure, in the electronic device, the heat dissipation member applied to the conductive pattern portion may be extended up to the area adjacent to the electric component, thus easily diffusing the heat to be generated from the electric component.

According to certain embodiments of the disclosure, in the electronic device, as the heat dissipation member applied to the conductive pattern portion is configured to contact a portion of the broadband antenna, it is possible to enhance heat generation performance and eliminate the need for a separate additional space for a heat dissipation member. This way, the internal space of the electronic device is more efficiently utilized.

The disclosure is not limited to the foregoing embodiments but various modifications or changes may rather be made thereto without departing from the spirit and scope of the disclosure.

Figure 1:
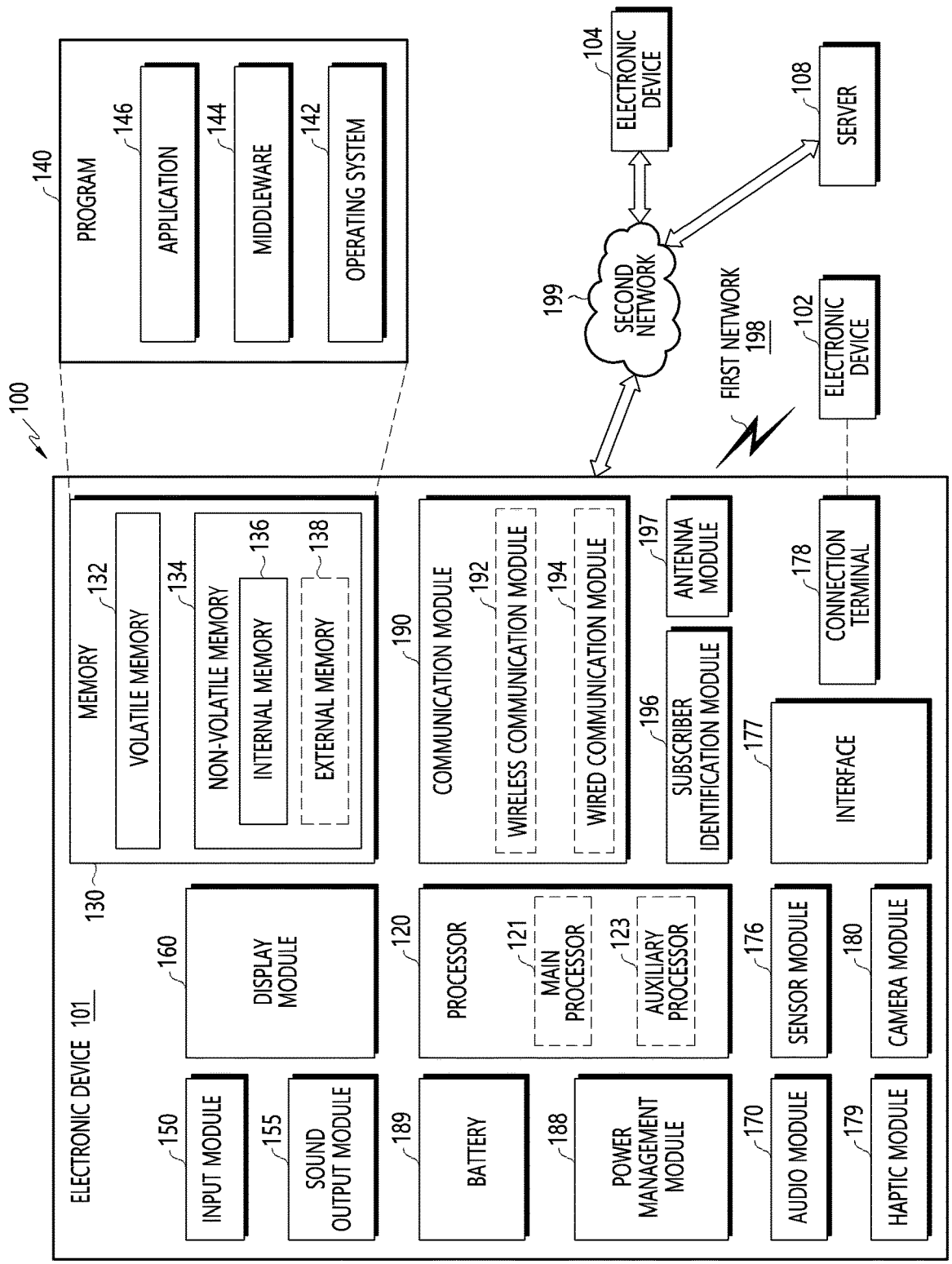
FIG. 1 is a view illustrating an electronic device in a network environment according to an embodiment.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above. It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
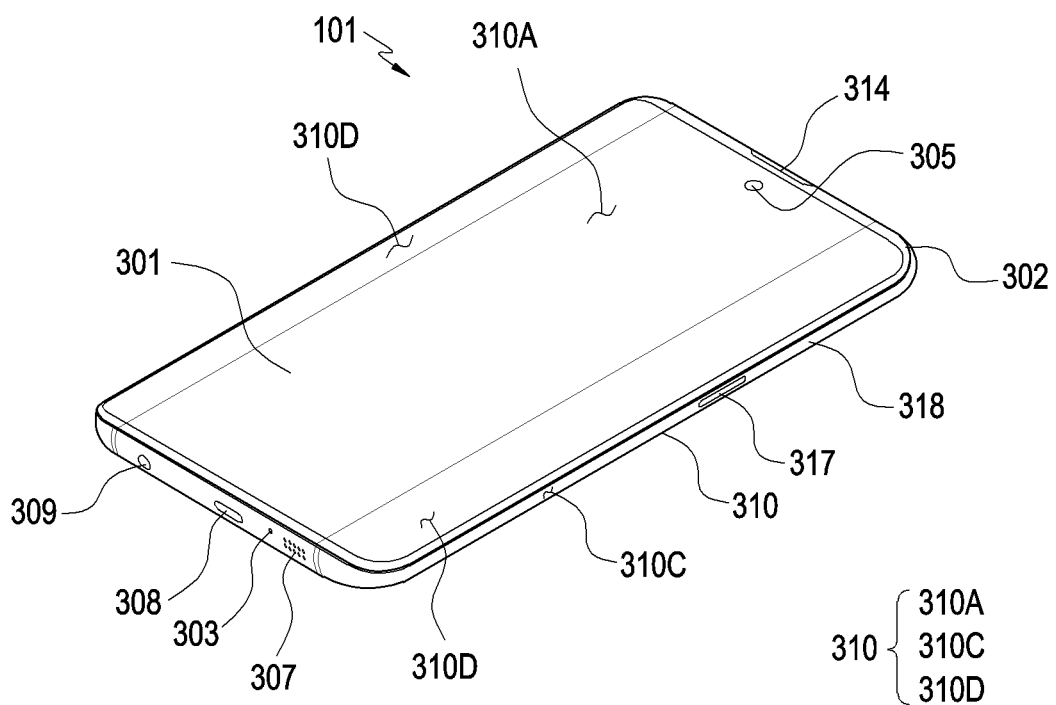
FIG. 2 is a front perspective view illustrating an electronic device according to an embodiment of the disclosure.
Figure 3:
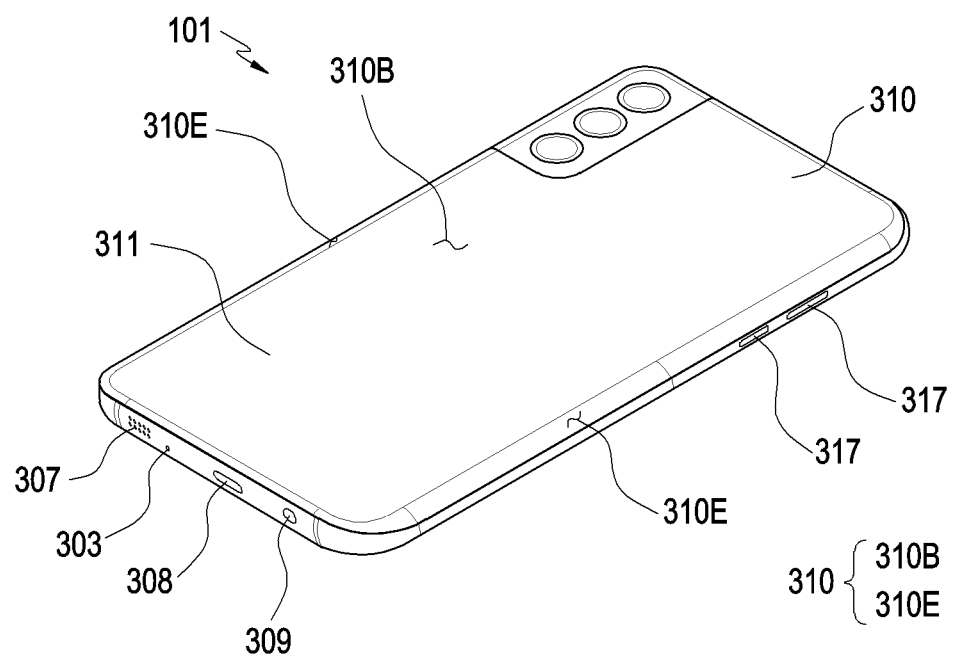
FIG. 3 is a rear perspective view illustrating an electronic device according to an embodiment of the disclosure.

FIG. 2 is a front perspective view illustrating an electronic device according to an embodiment of the disclosure. FIG. 3 is a rear perspective view illustrating an electronic device according to an embodiment of the disclosure.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A and side surface 310C of FIG. 2 and the rear surface 310B of FIG. 3. According to an embodiment, at least part of the front surface 310A may have a substantially transparent front plate 302 (e.g., glass plate or polymer plate including various coat layers). The rear surface 310B may be formed by a rear plate 311. The rear plate 311 may be made of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge regions 310D, which seamlessly and bendingly extend from the first surface 310A to the rear plate 311, on both the long edges of the front plate 302. In the embodiment (refer to FIG. 3) illustrated, the rear plate 311 may include two second edge regions 310E, which seamlessly and bendingly extend from the rear surface 310B to the front plate, on both the long edges. According to an embodiment, the front plate 302 (or the rear plate 311) may include only one of the first edge regions 310D (or the second edge regions 310E). Alternatively, the first edge regions 310D or the second edge regions 301E may partially be excluded. According to an embodiment, at side view of the electronic device 101, the side bezel structure 318 may have a first thickness (or width) for sides that do not have the first edge regions 310D or the second edge regions 310E and a second thickness, which is smaller than the first thickness, for sides that have the first edge regions 310D or the second edge regions 310E.

According to an embodiment, the electronic device 101 may include at least one of a display 301, audio modules 303, 307, and 314 (e.g., the audio module 170 of FIG. 1), a sensor module (e.g., the sensor module of FIG. 1). 176), camera modules 305 and 312 (e.g., the camera module 180 of FIG. 1), a key input device 317 (e.g., the input module 150 of FIG. 1), and connector holes 308 and 309 (e.g., the connection terminal 178 of FIG. 1). According to an embodiment, the electronic device 101 may exclude at least one (e.g., the connector hole 309) of the components or may add other components.

According to an embodiment, the display 301 may be visually exposed through, e.g., a majority portion of the front plate 302. According to an embodiment, at least a portion of the display 301 may be exposed through the front plate 302 forming the front surface 310A and the first edge regions 310D. According to an embodiment, the edge of the display 301 may be formed to be substantially the same in shape as the adjacent outer edge of the front plate 302. According to another embodiment (not shown), the interval between the outer edge of the display 301 and the outer edge of the front plate 302 may remain substantially even to maximize the area of exposure of the display 301.

According to an embodiment, the surface (or the front plate 302) of the housing 310 may include a screen display area formed as the display 301 is visually exposed. For example, the screen display area may include the front surface 310A and first edge areas 310D.

According to another embodiment (not shown), a recess or opening may be formed in a portion of the screen display region (e.g., the front surface 310A or the first edge region 310D) of the display 301, and at least one or more of the audio module 314, sensor module (not shown), light emitting device (not shown), and camera module 305 may be aligned with the recess or opening. According to another embodiment (not shown), at least one or more of the audio module 314, sensor module (not shown), camera module 305, fingerprint sensor (not shown), and light emitting device (not shown) may be included on the rear surface of the screen display region of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge regions 310D and/or the second edge regions 310E.

According to an embodiment, the first camera module 305 of the camera modules 305 and 312 and/or the sensor module may be disposed in the internal space of the electronic device 101, and may be exposed to the external environment through the transmissive area of the display 301. According to an embodiment, the area facing the first camera module 305 of the display 301 may be formed as a transmissive area having a designated transmittance, as a part of the area displaying content. According to an embodiment, the transmissive area may have a transmittance in a range from about 5% to about 20%. The transmissive area may include an area overlapping an effective area (e.g., angle-of-view area) of the first camera module 305 through which light incident on the image sensor to generate images. For example, the transmissive area of the display 301 may include an area having a lower pixel density and/or wiring density than the surrounding area. For example, the transmissive area may replace the recess or opening.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made—e.g., only some of the audio modules may be mounted, or another audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or another different sensor module may be added.

According to an embodiment, the camera modules 305 and 312 may include a first camera module 305 disposed on the front surface 310A of the electronic device 101, and a rear camera device 312 and/or a flash (not shown) disposed on the rear surface 310B. The camera modules 305 and 312 may include one or more lenses, an image sensor, and/or an image signal processor. The flash (not shown) may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305 and 312 are not limited to the above-described structure. Depending on the structure of the electronic device 101, various design changes may be made—e.g., only some of the camera modules may be mounted, or another camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the camera modules 305 and 312 may be, for example, a wide-angle camera and at least another of the plurality of camera modules may be a telephoto camera. Similarly, at least one of the camera modules 305 and 312 may be, for example, a front camera and at least another of the plurality of camera modules may be a rear camera. Further, the camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

According to an embodiment, the light emitting device (not shown) may be disposed on, e.g., the front surface 310A of the housing 310. The light emitting device (not shown) may provide, e.g., information about the state of the electronic device 101 in the form of light signals or visual notifications. According to another embodiment, the light emitting device (not shown) may provide a light source that interacts with, e.g., the front camera module 305. The light emitting device (not shown) may include, e.g., a light emitting diode (LED), an infrared (IR) LED, and/or a xenon lamp.

According to an embodiment, the connector holes 308 and 309 may include, e.g., a first connector hole 308 for receiving a connector (e.g., a universal serial bus (USB)

connector) for transmitting or receiving power and/or data to/from an external electronic device and/or a second connector hole (e.g., an earphone jack) 309 for receiving a connector for transmitting or receiving audio signals to/from the external electronic device.

According to an embodiment, the first camera module 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the second camera module 312 may be disposed inside the housing 310 so that the lens is exposed to the second surface 310B of the electronic device 101. For example, the second camera module 312 may be disposed on a printed circuit board (e.g., the printed circuit board 340 of FIG. 4).

According to an embodiment, the first camera module 305 and/or the sensor module may be disposed to be exposed to the external environment through a transparent area from the internal space of the electronic device 101 to the front plate 302 of the display 301. Further, some sensor module 304 may be disposed to perform its functions without being visually exposed through the front plate 302 while being in the internal space of the electronic device.

Figure 4:
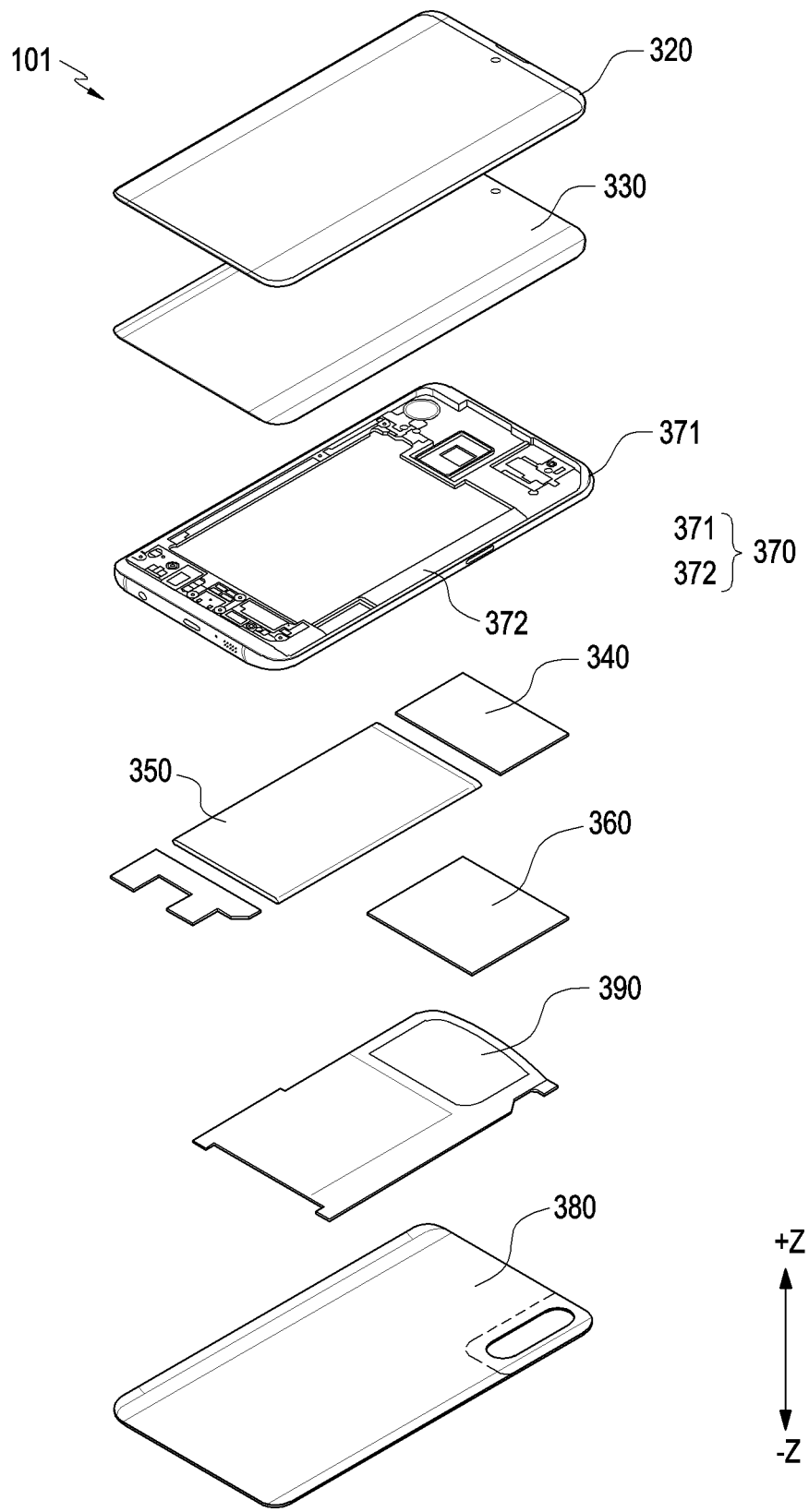
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, according to an embodiment, an electronic device 101 (e.g., the electronic device 101 of FIGS. 1 to 3) may include a supporting bracket 370, a front plate 320 (e.g., the front plate 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear case), an antenna 390 (e.g., the antenna module 197 of FIG. 1), and a rear plate 380 (e.g., the rear plate 311 of FIG. 2). The supporting bracket 370 of the electronic device 101 according to an embodiment may include a side bezel structure 371 (e.g., the side bezel structure 318 of FIG. 2) and a first supporting member 372.

According to an embodiment, the electronic device 101 may exclude at least one (e.g., the first supporting member 372 or second supporting member 360) of the components or may add other components. At least one of the components of the electronic device 101 may be the same or similar to at least one of the components of the electronic device 101 of FIG. 2 or 3 and no duplicative description is made below.

According to an embodiment, the first supporting member 372 may be disposed inside the electronic device 101 to be connected with the side bezel structure 371 or integrated with the side bezel structure 371. The first supporting member 372 may be made of, e.g., metal and/or non-metallic material (e.g., polymer). The display 330 may be joined onto one surface of the first supporting member 372, and the printed circuit board 340 may be joined onto the opposite surface of the first supporting member 372.

According to an embodiment, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to an embodiment, the printed circuit board 340 may include a flexible printed circuit board type radio frequency cable (FRC). For example, the printed circuit board 340 may be disposed on at least a portion of the first supporting member 372 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to an embodiment, the second supporting member 360 (e.g., a rear case) may be disposed between the printed circuit board 340 and the antenna 390. For example, the second supporting member 360 may include one surface to which at least one of the printed circuit board 340 and the battery 350 is coupled, and another surface to which the antenna 390 is coupled.

According to an embodiment, the antenna 390 may be disposed between the rear plate 380 and the battery 350. The antenna 390 may include, e.g., a near-field communication (NFC) antenna, a wireless charging antenna, and/or a magnetic secure transmission (MST) antenna. The antenna 390 may perform short-range communication with, e.g., an external device or may wirelessly transmit or receive power necessary for charging. According to an embodiment, an antenna structure may be formed by a portion of the side bezel structure 371 or the first supporting member 372 or a combination thereof.

According to an embodiment, the rear plate 380 may form at least a portion of the rear surface (e.g., the second surface 310B of FIG. 3) of the electronic device 101.

Figure 5:
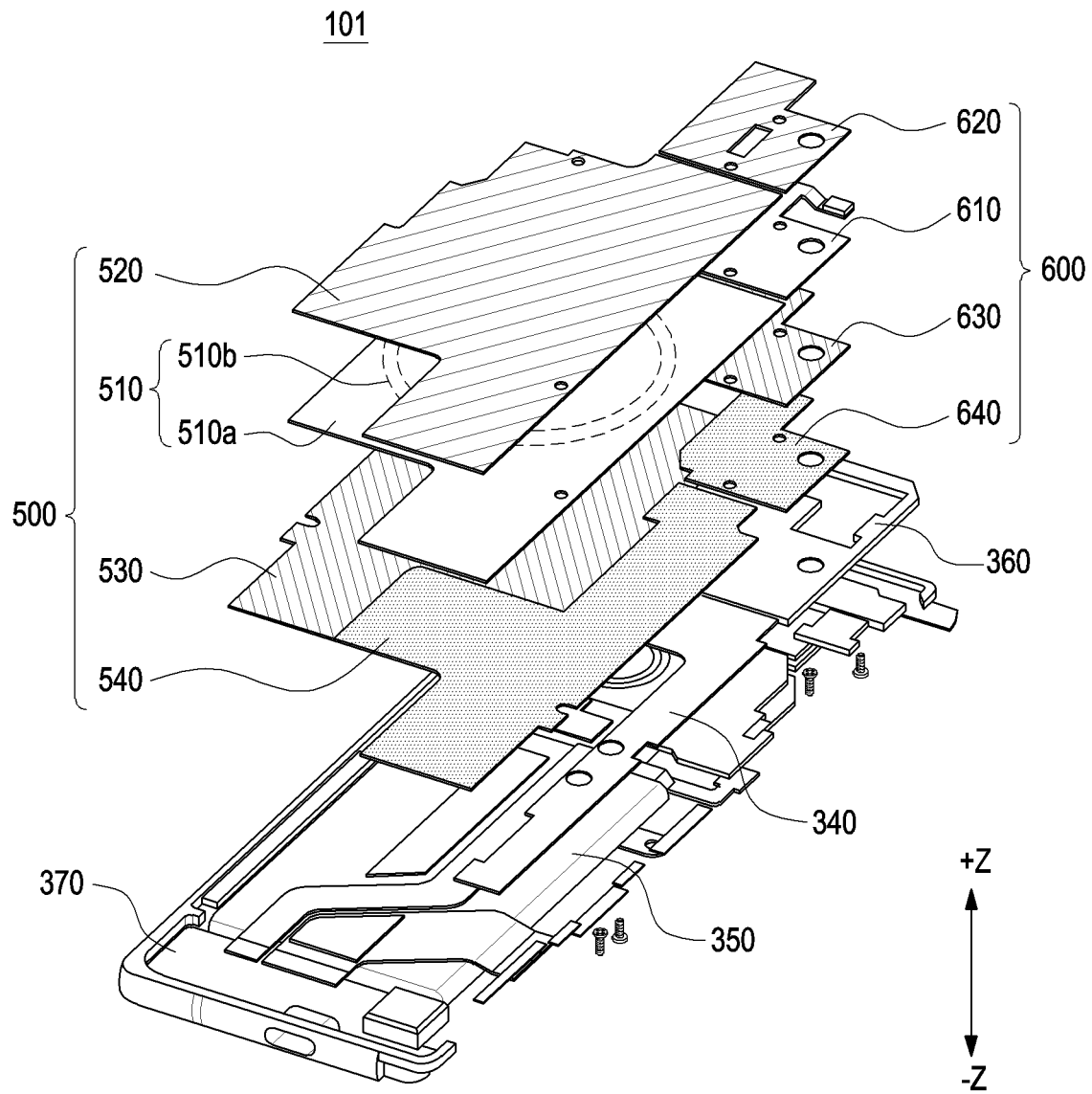
FIG. 5 is an exploded perspective view illustrating an arrangement relationship between a supporting bracket, a second supporting member (e.g., a rear case), and an antenna structure of an electronic device according to one of various embodiments of the disclosure.

FIG. 5 is an exploded perspective view illustrating an arrangement relationship between a supporting bracket, a second supporting member (e.g., a rear case), and an antenna structure of an electronic device according to one of various embodiments of the disclosure.

Figure 6:
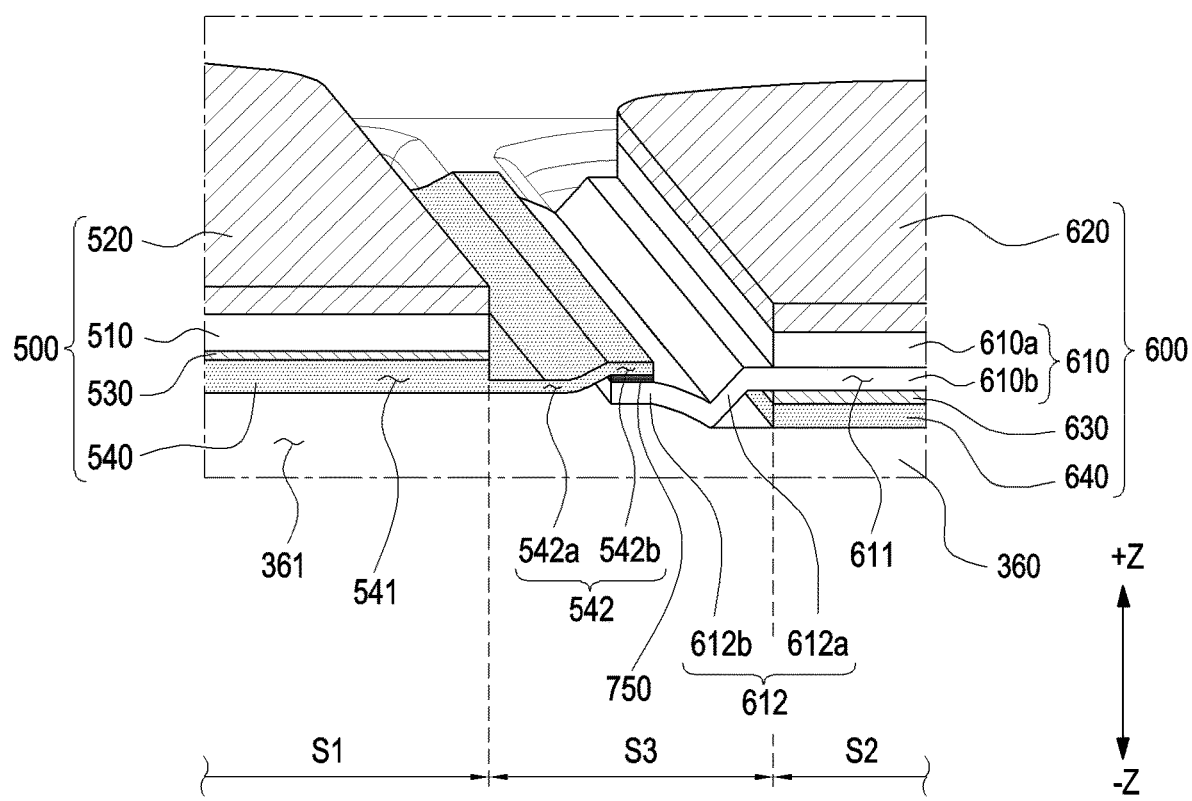
FIG. 6 is a perspective view illustrating an arrangement relationship between a first antenna assembly and a second antenna assembly disposed on a second supporting member (e.g., a rear case) according to one of various embodiments of the disclosure.

FIG. 6 is a perspective view illustrating an arrangement relationship between a first antenna assembly and a second antenna assembly disposed on a second supporting member (e.g., a rear case) according to one of various embodiments of the disclosure.

Figure 7:
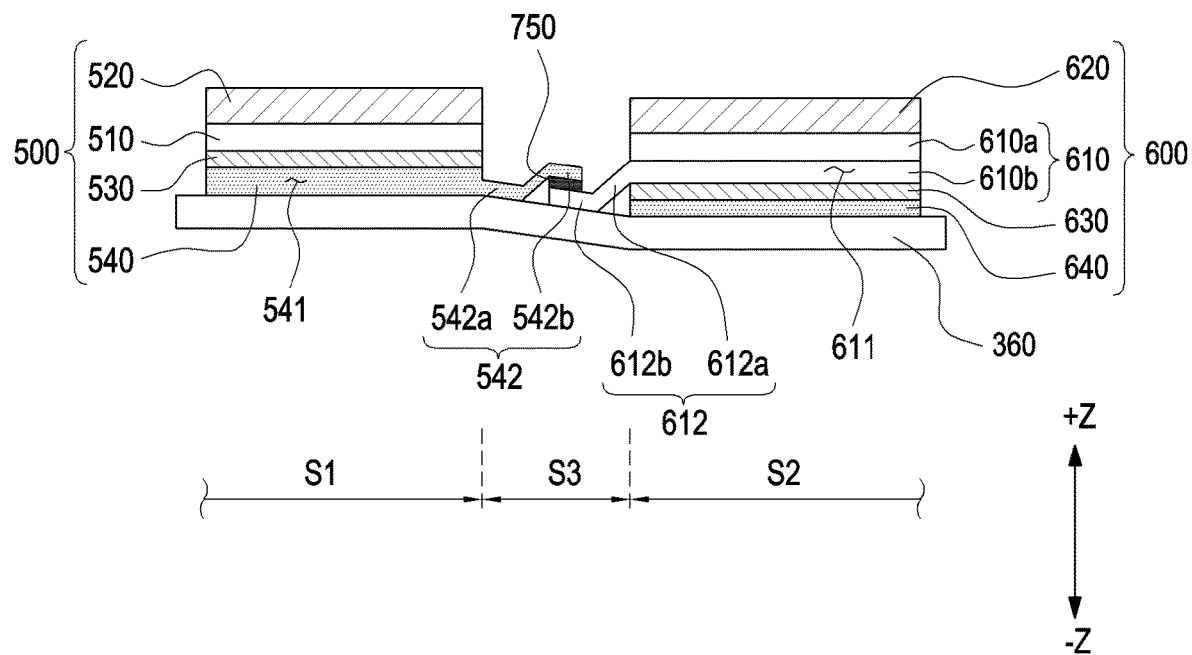
FIG. 7 is a cross-sectional view illustrating an arrangement relationship between a first antenna assembly and a second antenna assembly disposed on a second supporting member (e.g., a rear case) according to one of various embodiments of the disclosure.

FIG. 7 is a cross-sectional view illustrating an arrangement relationship between a first antenna assembly and a second antenna assembly disposed on a second supporting member (e.g., a rear case) according to one of various embodiments of the disclosure.

According to an embodiment, an electronic device (e.g., the electronic device 101 of FIGS. 1 to 4) may include a housing (e.g., the housing 310 of FIGS. 2 and 3), a circuit board (e.g., the printed circuit board 340 of FIG. 4), a supporting member 360, and an antenna structure 390 disposed in the housing 310. According to an embodiment, the housing 310 may include a front plate (e.g., the front plate 320 of FIG. 4), a rear plate (e.g., the rear plate 380 of FIG. 4), and a supporting bracket 370. The antenna structure 390 may include a first antenna assembly 500 and a second antenna assembly 600 disposed adjacent to the first antenna assembly 500.

The configuration of the supporting bracket 370, the circuit board 340, the supporting member 360, and the antenna structure 390 of the housing of FIGS. 5 to 7 may be identical in whole or part to the configuration of the supporting bracket 370, the printed circuit board 340, the second supporting member 360, and the antenna structure 390 of FIG. 4.

According to an embodiment, at least a portion of the supporting bracket 370 may form a side surface of the housing and may provide a space for mounting electronic components, such as the battery 350 and the circuit board 340.

According to an embodiment, the first antenna assembly 500 and the second antenna assembly 600 of the antenna structure 390 may be disposed on one surface of the supporting member 360. The supporting member 360 may be made of a non-conductive material and may include a first area S1 in which the first antenna assembly 500 is positioned and a second area S2 in which the second antenna assembly 600 is positioned and spaced apart from the first area S1. The supporting member 360 may further include a third area S3 positioned between the first area S1 and the second area S2 and connecting the first area S1 and the second area S2.

According to an embodiment, the first antenna assembly 500 of the antenna structure 390 may include a conductive pattern portion 510, a first elastic member 520, a shielding member 530, and a heat dissipation member 540. The first antenna assembly 500 may be designed to be disposed in one area (e.g., the first area S1) of the first surface 361 facing in a first direction (+Z-axis direction) of the supporting member 360 so that the radiation direction of the antenna faces the rear plate.

According to an embodiment, the conductive pattern portion 510 may include a conductive pattern 510b formed to generate a magnetic field and a base member 510a disposed parallel to at least a portion of the front plate 320 and/or the rear plate 380. According to an embodiment, the base member 510a may include a film made of an insulator or dielectric material and provide an area on which the conductive pattern 510b is disposed. For example, the conductive pattern portion 510 may be implemented as a flexible printed circuit board. As another example, the conductive pattern portion 510 may be implemented as a combination of a flexible printed circuit board and a multilayer circuit board.

According to an embodiment, if the base member 510a is a multi-layer circuit board, one conductive pattern 510b may be formed on an appropriate layer of the layers constituting the base member 510a, or a plurality of conductive patterns 510b each may be formed on an appropriate layer of the layers constituting the base member 510a. As another example, at least one conductive pattern 510b may be formed by etching (e.g., wet etching or dry etching) a portion of the conductive layer formed on the base member 510a by printing, deposition, painting, and/or plating using a conductive ink.

According to an embodiment, the at least one conductive pattern 510b may form a loop antenna and may have a form in which a plurality of loop antennas for communication are arranged on one flexible printed circuit board. According to another embodiment, the at least one conductive pattern 510b may be an antenna made of one flexible printed circuit board and may include at least one of NFC, MST, or loop antenna for wireless communication. For example, the antenna made of one flexible printed circuit board may be a loop antenna for wireless charging.

According to an embodiment, the at least one conductive pattern 510b may be a coil including a plurality of turns substantially parallel to one surface of the front plate and/or the rear plate. For example, the conductive line forming the at least one conductive pattern 510b may include a plurality of turns wound to form a closed loop shape formed of a combination of a circle, a polygon, or a curve and a straight line, etc., and it may be disposed substantially parallel to the housing 310 or plate (e.g., the rear plate 380 of FIG. 4) when the base member 510a is mounted in the housing 310.

According to an embodiment, the first elastic member 520 may be disposed in a first direction (+Z-axis direction) of the conductive pattern portion 510. The first elastic member 520 may be a structure for cushioning impacts applied to the conductive pattern portion 510 and may be implemented with an elastic material, such as sponge, foam, or rubber. For example, the sponge may include a material such as polyurethane (PU) or polyethylene (PE).

According to an embodiment, the shielding member 530 and the heat dissipation member 540 may be disposed in a second direction (−Z-axis direction) opposite to the first direction (+Z-axis direction) of the conductive pattern portion 510. For example, the shielding member 530 may be disposed on the conductive pattern portion 510, and the heat dissipation member 540 may be stacked on the shielding member 530. As another example, when viewed from above the first antenna assembly 500, at least a portion of the heat dissipation member 540 may be disposed to overlap the conductive pattern portion 510. The shielding member 530 may provide the function for shielding electromagnetic waves that may be generated by the conductive pattern portion 510. The heat dissipation member 540 may provide heat conduction for transferring the heat generated by the conductive pattern portion 510 to the external environment of the electronic device.

According to an embodiment, the heat dissipation member 540 has a flexible structure and may include a first heat dissipation portion 541 disposed to face the shielding member 530 and a second heat dissipation portion 542 extending to the second antenna assembly 600. The first heat dissipation portion 541 may be disposed in contact with the first area S1 of the supporting member 360, and the second heat dissipation portion 542 may be disposed along at least a portion of the third area S3 of the supporting member 360. According to an embodiment, the second heat dissipation portion 542 of the heat dissipation member 540 may include a 2-1th heat dissipation portion 542a extending from one end of the first heat dissipation portion 541 and a 2-2th heat dissipation portion 542b extending from the 2-1th heat dissipation portion 542a and disposed in contact with at least a portion of the second antenna assembly 600. The second heat dissipation portion 542 may be made with the same material as the first heat dissipation portion 541.

According to an embodiment, at least a portion of the heat dissipation member 540 may be connected to (e.g., in physical contact with) the second antenna assembly 600 to expand a path through which the heat generated from the conductive pattern portion 510 is diffused. For example, the heat generated from the conductive pattern 510b of the conductive pattern portion 510 may be transferred through the first heat dissipation portion 541 and the second heat dissipation portion 542 of the heat dissipation member 540 to a large area of the electronic device to be more quickly dissipated. The material of the heat dissipation member 540 may include, e.g., at least one of high-thermal conductance materials, such as graphite, carbon nanotubes, a natural regenerated material, silicone, silicon, or copper foil. As another example, the material of the heat dissipation member 540 may be the same material (e.g., copper) as the ground portion 610b of the second antenna assembly 600.

According to an embodiment, the second antenna assembly 600 of the antenna structure 390 may include an antenna 610, a second elastic member 620, a coverlay 630, and an adhesive member 640. The second antenna assembly 600 may be designed to be disposed in one area (e.g., the second area S2) of the first surface 361 facing in a first direction (+Z-axis direction) of the supporting member 360 so that the radiation direction of the antenna faces the rear plate.

According to an embodiment, the antenna 610 of the second antenna assembly 600 may be an ultra-wide band (UWB) antenna. The antenna 610 may be a double patch antenna and may include, e.g., an antenna circuit board 610a, a conductive portion (e.g., patch-type) disposed on one surface (e.g., one surface facing in the first direction (+Z-axis direction)) of the antenna circuit board 610a, and a ground portion 601b disposed on another surface (e.g., one surface facing in the second direction (−Z-axis direction)) of the antenna circuit board 610a.

According to an embodiment, the ground portion 610b of the antenna 610 may be flexible and may include a first portion disposed to face the coverlay 630 and a second portion 612 extending to the first antenna assembly 500. The first portion 611 may be disposed over the second area S2 of the supporting member 360, and the second portion 612 may be disposed along at least a portion of the third area S3 of the supporting member 360. According to an embodiment, the second portion 612 of the ground portion 610b may include a 2-1th portion 612a extending from one end of the first portion 611 and a 2-2th portion 612b extending from the 2-1th portion 612a and disposed in contact with at least a portion (e.g., the 2-2th heat dissipation portion 542b) of the first antenna assembly 500. The second portion 612 may be made with the same material as the rest of the ground portion 610b. The material of the second portion 612 may be different from the material from the second heat dissipation portion 542.

According to an embodiment, at least a portion of the ground portion 610b may be connected to (e.g., in physical contact with) the heat dissipation member 540 of the second antenna assembly 600 to expand a path through which the heat generated from the conductive pattern portion 510 is diffused. The 2-2th portion 612b of the ground portion 610b and the 2-2th heat dissipation portion 542b of the heat dissipation member 540 may be disposed in contact with each other. For example, when viewed from above the third area S3 of the supporting member 360, the 2-2th portion 612b of the ground portion 610b and the 2-2th heat dissipation portion 542b of the heat dissipation member 540 may be disposed to overlap each other. As another example, the 2-2th portion 612b of the ground portion 610b and the 2-2th heat dissipation portion 542b of the heat dissipation member 540 may be adhered together by the conductive adhesive 750 to maintain heat diffusion. The conductive adhesive 750 may include at least one material capable of heat diffusion. For example, the conductive adhesive 750 may be a thermally conductive adhesive or a metallic double-sided tape. The ground portion 610b may be designed as a copper plate.

According to an embodiment, the ground portion 610b and the heat dissipation member 540 may be integrally designed. For example, the ground portion 610b and the heat dissipation member 540 may be manufactured in the form of a single copper plate and be disposed to cross the first area S1, third area S3, and second area S2 of the supporting member 360 without a separate contact portion.

In an electronic device, an electric component (e.g., an AP) may be positioned in the second direction (−Z-axis direction) of the third area S3 of the supporting member 360. Thus, the heat dissipation structure of the rear surface (e.g., one surface facing in the second direction (−Z-axis direction)) of the second antenna assembly 600 may be weak. According to an embodiment of the disclosure, the heat generated from an electric component (e.g., an AP) disposed adjacent to the second antenna assembly 600 may be transferred through the ground portion 610b to the heat dissipation member 540, and the heat transferred to the heat dissipation member 540 may be diffused and quickly discharged to the exterior of the electronic device.

Table 1 below shows the results of measurements of temperature before and after at least a portion of the heat dissipation member 540 is expanded up to the vicinity of the antenna 610.

TABLE 1

| | Material of heat dissipation member | Temperature of front surface | Temperature of rear surface | Temperature gap between front/rear surfaces |
|---|---|---|---|---|
| Conventional art | Graphite (GFX 4.0) | 43.3 | 44.8 | 1.5 |
| The disclosure | Graphite (GFX 4.0) | 43.6 | 43.8 | 0.2 |

Before the embodiment of the disclosure is applied, the electric component (e.g., an AP) is disposed adjacent to the rear surface of the electronic device. Thus, the heat generated from the electric component may increase the temperature of the rear surface. For example, it may be identified that the temperature of the rear surface of the electronic device is about 1.5 degrees higher than that of the front surface. According to an embodiment of the disclosure, as the heat dissipation member (e.g., graphite material) extends adjacent to the electric component, the heat generated in the electrical device may be rapidly diffused through the heat dissipation member. Accordingly, it may be identified that the temperature gap between the front and rear surfaces of the electronic device is substantially reduced by about 1.3 degrees as compared to the conventional art.

According to an embodiment, the second elastic member 620 may be disposed in the first direction (+Z-axis direction) of the antenna 610. The second elastic member 620 may be a structure for absorbing impact applied to the antenna 610 and may include an elastic material, such as sponge, foam, or rubber. For example, the sponge may be made of materials such as polyurethane (PU) or polyethylene (PE).

According to an embodiment, the coverlay 630 and the adhesive member 640 may be disposed in the second direction (−Z-axis direction) opposite to the first direction (+Z-axis direction) of the antenna 610. For example, the coverlay 630 may be disposed on the antenna 610, and the adhesive member 640 may be stacked on the coverlay 630. The coverlay 630 may cover one surface of the antenna 610 facing in the second direction (−Z-axis direction) and may protect the internal circuit layers of the antenna circuit board 610a even without an additional bonding sheet. For example, the coverlay 630 may be a coverlay film and a cover resin layer stacked on one or both surfaces of the coverlay film. The cover resin layer may be a polyimide resin configured as an electrical insulating layer. The adhesive member 640 is flexible and may adhere the second antenna assembly 600 and the supporting member 360. The adhesive member 640 may tightly dispose the second antenna assembly 600 to the second area S2 of the supporting member 360 and, as it is implemented using an elastic material, it may secure the stability of the second antenna assembly 600.

Figure 8:
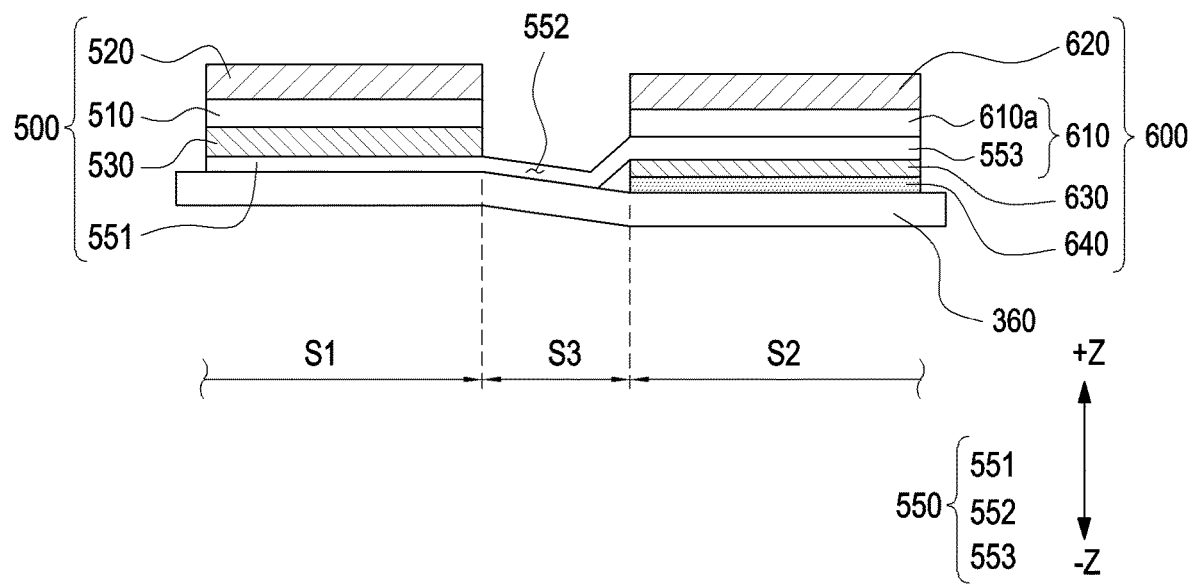
FIG. 8 is a cross-sectional view illustrating an arrangement relationship between a first antenna assembly and a second antenna assembly disposed on a second supporting member (e.g., a rear case) according to another one of various embodiments of the disclosure.

FIG. 8 is a cross-sectional view illustrating an arrangement relationship between a first antenna assembly and a second antenna assembly disposed on a second supporting member (e.g., a rear case) according to another one of various embodiments of the disclosure.

According to various embodiments, an electronic device (e.g., the electronic device 101 of FIGS. 1 to 4) may include a housing (e.g., the housing 310 of FIGS. 2 and 3) and a supporting member 360 and an antenna structure disposed in the housing 310.

The configuration of the supporting member 360 and the antenna structure 390 in the housing of FIG. 8 may be identical in whole or part to the configuration of the supporting member 360 and antenna structure 500 or 600 of FIGS. 5 to 7.

According to various embodiments, the antenna structure may include a first antenna assembly 500 and a second antenna assembly 600 disposed adjacent to the first antenna assembly 500. The first antenna assembly 500 and the second antenna assembly 600 of the antenna structure 390 may be disposed on one surface of the supporting member 360. The supporting member 360 may be made of a non-conductive material and may include a first area S1 in which the first antenna assembly 500 is positioned and a second area S2 in which the second antenna assembly 600 is positioned and spaced apart from the first area S1. The supporting member 360 may further include a third area S3 positioned between the first area S1 and the second area S2 and connecting the first area S1 and the second area S2.

According to various embodiments, the first antenna assembly 500 of the antenna structure 390 may include a conductive pattern portion 510, a first elastic member 520, a shielding member 530, and a heat dissipation member 540. The heat dissipation member 550, the shielding member 530, the conductive pattern portion 510, and the first elastic member 520 may be sequentially stacked with respect to one surface facing in the first direction (+Z-axis direction) of the supporting member 360.

According to an embodiment, the conductive pattern portion 510 may include at least one conductive pattern, and the conductive pattern may include a loop antenna for wireless communication. The first elastic member 520 may be a structure for absorbing impacts applied to the conductive pattern portion 510 and may be made with an elastic material. The shielding member 530 may provide the function for shielding electromagnetic waves that may be generated by the conductive pattern portion 510.

According to an embodiment, the second antenna assembly 600 of the antenna structure 390 may include an antenna 610, a second elastic member 620, a coverlay 630, and an adhesive member 640. The adhesive member 640, the coverlay 630, the antenna 610, and the second elastic member 620 may be sequentially stacked with respect to one surface facing in the first direction (+Z-axis direction) of the supporting member 360.

According to an embodiment, the antenna 610 may be an ultra-wide band (UWB) antenna. The second elastic member 620 may be a structure for cushioning impacts applied to the antenna 610 and may be made with an elastic material. The coverlay 630 may cover one surface of the antenna 610 facing in the second direction (−Z-axis direction). The adhesive member 640 may have a flexible structure and adhere the second antenna assembly 600 and the supporting member 360.

According to an embodiment, the antenna 610 may include an antenna circuit board 610a, a conductive portion (e.g., patch-type) disposed on one surface (e.g., one surface facing in the first direction (+Z-axis direction)) of the antenna circuit board 610a, and a heat dissipation member 553 (e.g., a third heat dissipation portion 553) disposed on another surface (e.g., one surface facing in the second direction (−Z-axis direction)) of the antenna circuit board 610a. The heat dissipation member may also be the ground of the antenna 610.

According to an embodiment, the heat dissipation member 550 may be designed as a single member to provide a structure for dissipating heat of the first antenna assembly 500 while simultaneously being the antenna ground of the second antenna assembly 600. The heat dissipation member 550 may include a first heat dissipation portion 551 positioned in the first area S1 of the supporting member 360, a third heat dissipation portion 553 positioned in the second area S2 of the supporting member 360, and a second heat dissipation portion 552 positioned in the third area S3 of the supporting member 360. As the first antenna assembly 500 other than the heat dissipation member 550 is positioned in the first area S1 of the supporting member 360, and the second antenna assembly 600 other than the heat dissipation member 550 is positioned in the second area S2 of the supporting member 360, they may be spaced apart from each other. The heat dissipation member 550 may expand the heat diffusion path by connecting the first antenna assembly 500 and the second antenna assembly 600 to each other.

According to an embodiment, as the heat generated from the conductive pattern portion 510 of the first antenna assembly 500 is diffused along the first heat dissipation portion 551, second heat dissipation portion 552, and third heat dissipation portion 553 of the heat dissipation member 540, the heat may reach the second antenna assembly 600 where relatively less heat is generated, thus providing an enhanced heat transfer effect. According to another embodiment, the heat generated from an electric component (e.g., an application processor (AP)) disposed adjacent to the second antenna assembly 600 may be transferred to the third heat dissipation portion 553 and/or second heat dissipation portion 552 of the heat dissipation member 550 and then diffused up to the first heat dissipation portion 551, thus providing an enhanced heat transfer effect.

Figure 9:
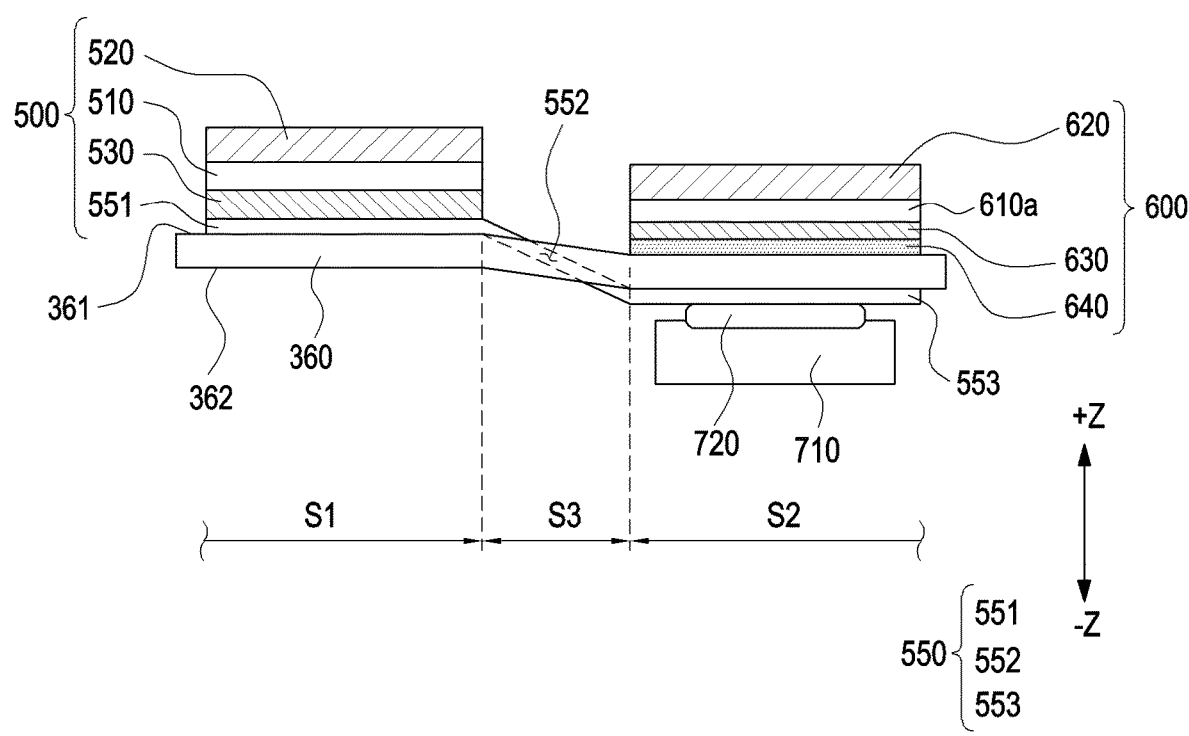
FIG. 9 is a cross-sectional view illustrating an arrangement relationship between a first antenna assembly and a second antenna assembly disposed on a second supporting member (e.g., a rear case) according to yet another one of various embodiments of the disclosure.

FIG. 9 is a cross-sectional view illustrating an arrangement relationship between a first antenna assembly and a second antenna assembly disposed on a second supporting member (e.g., a rear case) according to another one of various embodiments of the disclosure.

According to various embodiments, an electronic device (e.g., the electronic device 101 of FIGS. 1 to 4) may include a housing (e.g., the housing 310 of FIGS. 2 and 3) and a supporting member 360 and an antenna structure disposed in the housing 310.

The configuration of the supporting member 360 and the antenna structure in the housing of FIG. 9 may be identical in whole or part to the configuration of the supporting member 360 and antenna structure 500 or 600 of FIGS. 5 to 7.

According to various embodiments, the antenna structure 390 may include a first antenna assembly 500 and a second antenna assembly 600 disposed adjacent to the first antenna assembly 500. The first antenna assembly 500 and the second antenna assembly 600 of the antenna structure 390 may be disposed on one surface of the supporting member 360. The supporting member 360 may be made of a non-conductive material and may include a first area S1 in which the first antenna assembly 500 is positioned and a second area S2 in which the second antenna assembly 600 is positioned and spaced apart from the first area S1. The supporting member 360 may further include a third area S3 positioned between the first area S1 and the second area S2 and connecting the first area S1 and the second area S2. The third area S3 may have a structure in which at least one side of the supporting member 360 is opened, and at least a portion of the heat dissipation member 550 may be disposed in the opened structure. For example, the third area S3 may have an opening in which the heat dissipation member 550 passes through the inside of the supporting member 360. As another example, the opened structure may have a structure in which a portion of one side edge of the supporting member 360 is opened (e.g., C shape).

According to an embodiment, the first antenna assembly 500 of the antenna structure 390 may include a conductive pattern portion 510, a first elastic member 520, a shielding member 530, and a heat dissipation member 550. The heat dissipation member 550, the shielding member 530, the conductive pattern portion 510, and the first elastic member 520 may be sequentially stacked with respect to the first surface 361 facing in the first direction (+Z-axis direction) of the supporting member 360.

According to an embodiment, the conductive pattern portion 510 may include at least one conductive pattern, and the conductive pattern may include a loop antenna for wireless communication. The first elastic member 520 may be a structure for absorbing impacts applied to the conductive pattern portion 510 and may be made with an elastic material. The shielding member 530 may provide shielding for the electromagnetic waves that may be generated by the conductive pattern portion 510.

According to an embodiment, the second antenna assembly 600 of the antenna structure 390 may include an antenna 610, a second elastic member 620, a coverlay 630, and an adhesive member 640. The adhesive member 640, the coverlay 630, the antenna 610, and the second elastic member 620 may be sequentially stacked with respect to the first surface 361 facing in the first direction (+Z-axis direction) of the supporting member 360. An electric component 710 and a heat transfer member 720 may be positioned on the second surface 362 facing in the second direction (−Z-axis direction) opposite to the first direction (+Z-axis direction) of the supporting member 360. For example, the heat transfer member 720 and the electric component 710 may be sequentially stacked with respect to the second surface 362.

According to an embodiment, a plurality of electric components may be disposed on at least one side surface of the circuit board (e.g., the circuit board 340 of FIG. 4) disposed under the supporting member 360 (e.g., disposed in the second direction (−Z-axis direction)). Some electric components 710 among the plurality of electric components are heat sources that generate heat and may be, e.g., at least one chip disposed on at least one side surface of the circuit board 340, and may include at least one of a power management integrated circuit (PMIC), a power amplifier (PAM), an application processor (AP), a communication processor (CP), a charger integrated circuit (IC), or a DC converter. In the illustrated embodiment, the electrical device 710 may be an AP or a PMIC.

According to an embodiment, the heat transfer member 720 may be made of a carbon fiber thermal interface material (TIM) which may be able to transfer the heat generated from the electric component 710. However, the heat transfer member 720 is not limited to the carbon fiber TIM and may include various heat dissipation materials or members for transferring the heat generated from the electric component 710 to an external or cover of the electronic device. For example, the heat transfer member 720 may include at least one of a thermal interface material (TIM), a heat pipe, a vapor chamber, a heat dissipation sheet, or a heat dissipation paint. As another example, the carbon fiber TIM (carbon fiber TIM) may include at least one of a liquid phase thermal interface material (TIM) and/or a solid phase thermal interface material (TIM). According to an embodiment, a plurality of heat transfer members 720 may be configured. For example, if a plurality of electric components 710 are configured, heat transfer members 720 may be individually disposed in contact with the electric components 710.

According to an embodiment, the antenna 610 may be an ultra-wide band (UWB) antenna. The second elastic member 620 may be a structure for cushioning impacts applied to the antenna 610 and may be made with an elastic material. The coverlay 630 may cover one surface of the antenna 610 facing in the second direction (−Z-axis direction). The adhesive member 640 may be flexible and adhere the second antenna assembly 600 and the supporting member 360.

According to an embodiment, the antenna 610 may include an antenna circuit board 610a, a conductive portion (e.g., patch-type) disposed on one surface (e.g., one surface facing in the first direction (+Z-axis direction)) of the antenna circuit board 610a, and a heat dissipation member 550 (e.g., a third heat dissipation portion 553) disposed on another surface (e.g., one surface facing in the second direction (−Z-axis direction)) of the antenna circuit board 610a. The heat dissipation member 550 may be the ground of the antenna 610.

According to an embodiment, the heat dissipation member 550 may be designed as a single member to provide a structure for dissipating heat of the first antenna assembly 500 while simultaneously being the antenna ground of the second antenna assembly. The heat dissipation member 550 may include a first heat dissipation portion 551 positioned in the first area S1 of the supporting member 360, a third heat dissipation portion 553 positioned in the second area S2 of the supporting member 360, and a second heat dissipation portion 552 positioned in the third area S3 of the supporting member 360. As the first antenna assembly 500 other than the heat dissipation member 550 is positioned in the first area S1 of the supporting member 360, and the second antenna assembly 600 other than the heat dissipation member 550 is positioned in the second area S2 of the supporting member 360, they may be spaced apart from each other. The heat dissipation member 540 may expand the heat diffusion path by connecting the first antenna assembly 500 and the second antenna assembly 600 to each other.

According to an embodiment, the first heat dissipation portion 551 of the heat dissipation member 550 may be disposed between the shielding member 530 and the first surface 361 of the supporting member 360. The second heat dissipation portion 552 may extend from the first heat dissipation portion 551 and may be disposed to pass through the opened structure of the supporting member 360 and be formed up to the second surface 362 of the supporting member 360. The third heat dissipation portion 553 of the heat dissipation member 540 may extend from the second heat dissipation portion 552 and may be disposed on the second surface 362 of the supporting member 360 and thus be disposed to face (or contact) the electric component 710 and/or the heat transfer member 720.

According to an embodiment, as the heat generated from the conductive pattern portion 510 of the first antenna assembly 500 is diffused along the first heat dissipation portion 551, second heat dissipation portion 552, and third heat dissipation portion 553 of the heat dissipation member 550, the heat may reach the second antenna assembly 600 where relatively less heat is generated, thus providing an enhanced heat transfer effect. According to another embodiment, the heat generated from the electric component 710 disposed adjacent to the second surface 362 of the supporting member 360 may be transferred along the third heat dissipation portion 553 and second heat dissipation portion 542 of the heat dissipation member 550 disposed on the second surface 362 of the supporting member 360 and then diffused up to the first heat dissipation portion 551, thus providing an enhanced heat transfer effect. As the heat dissipation member 550 is disposed adjacent to the electric component 710, the heat generated from the electric component 710 may be quickly diffused to the exterior of the electronic device through the heat transfer member 720 and the heat dissipation member 550, so that it is possible to decrease the temperature of areas surrounding the electric component 710.

According to various embodiments of the disclosure, an electronic device (e.g., 101 of FIGS. 1 to 4) may comprise a housing (e.g., the housing 310 of FIGS. 2 and 3) including a front plate (e.g., 320 of FIG. 4) and a rear plate (e.g., 380 of FIG. 4), a non-conductive supporting member (e.g., 360 of FIG. 6) disposed in the housing to be adjacent to the rear plate, the supporting member including a first area (e.g., S1 of FIG. 6), a second area (e.g., S2 of FIG. 6) spaced apart from the first area, and a third area (e.g., S3 of FIG. 6) connecting the first area and the second area, a conductive pattern portion (e.g., 510 of FIG. 6) disposed on the first area of the supporting member and configured to generate a magnetic field, a heat dissipation member (e.g., 540 of FIG. 6) disposed to at least partially overlap the conductive pattern portion, and an antenna (e.g., 610 of FIG. 6) including a circuit board (e.g., 610a of FIG. 6), a conductive portion disposed on one surface of the circuit board, and a ground portion (e.g., 610b of FIG. 6) disposed on the other surface of the circuit board. The conductive portion of the antenna may be disposed in the second area. The heat dissipation member may extend from the first area to the third area, and the ground portion of the antenna may extend from the second area to the third area to contact at least a portion of the heat dissipation member.

According to various embodiments, the heat dissipation member and the ground portion may be integrally formed.

According to various embodiments, the electronic device may further comprise a main circuit board (e.g., 340 of FIG. 4) disposed between the supporting member and the front plate, in the housing and an electric component disposed on the main circuit board and disposed to at least partially overlap the second area of the supporting member.

According to various embodiments, the heat dissipation member and the ground portion may provide a path through which heat generated from the electric component is diffused through the ground portion to the heat dissipation member.

According to various embodiments, the conductive portion of the antenna may be a patch type and may implement an ultra-wide band (UWB) antenna.

According to various embodiments, the electronic device may further comprise a shielding member disposed between the conductive pattern portion and the heat dissipation member.

According to various embodiments, the heat dissipation member may be flexible and may include a first heat dissipation portion (e.g., 541 of FIG. 6) disposed to face the shielding member and a second heat dissipation portion (e.g., 542 of FIG. 6) extending to the antenna. The second heat dissipation portion may include a 2-1th heat dissipation portion (e.g., 542a of FIG. 6) extending from an end of the first heat dissipation portion and at least partially spaced apart from the third area of the supporting member and a 2-2th heat dissipation portion (e.g., 542b of FIG. 6) extending from the 2-1th heat dissipation portion and formed to overlap one area of the ground portion.

According to various embodiments, the electronic device may further comprise a conductive adhesive disposed between the 2-2th heat dissipation portion of the heat dissipation member and the one area of the ground portion to adhere the 2-2th heat dissipation portion and the one area of the ground portion and to provide a heat transfer path.

According to various embodiments, the heat dissipation member may include at least one of high-thermal conductance materials, the at least one high-thermal conductance material includes graphite, a carbon nanotube, a natural regenerated material, silicone, silicon, or a copper foil.

According to various embodiments, the conductive pattern portion may include a conductive pattern (e.g., 510b of FIG. 5) configured to generate an electromagnetic field and a base member (e.g., 510a of FIG. 5) disposed parallel to at least a portion of the front plate and/or the rear plate.

According to various embodiments, the conductive pattern may be an antenna for wireless charging including a plurality of turns substantially parallel to one surface of the rear plate and/or the front plate.

According to various embodiments, the electronic device may further comprise a first elastic member (e.g., 520 of FIG. 6) disposed between the rear plate and the conductive pattern portion to absorb an impact applied to the conductive pattern portion.

According to various embodiments, the electronic device may further comprise a second elastic member (e.g., 620 of FIG. 6) disposed between the rear plate and the antenna to absorb an impact applied to the antenna.

According to various embodiments, the electronic device may further comprise a main circuit board disposed between the supporting member and the front plate, in the housing and an electric component disposed on the main circuit board and disposed to at least partially overlap at least a portion of the antenna. The third area of the supporting member may include an opened structure. At least a portion of the heat dissipation member may be disposed to pass through the opened structure.

According to various embodiments, a first heat dissipation portion of the heat dissipation member may be disposed on one surface facing in a first direction of the supporting member, in the first area, and a second heat dissipation portion of the heat dissipation member may be disposed on one surface facing in a second direction, opposite to the first direction of the supporting member, in the second area to be disposed adjacent to the electric component.

According to various embodiments of the disclosure, an electronic device (e.g., 101 of FIGS. 1 to 4) may comprise a housing (e.g., 310 of FIGS. 2 and 3) including a plate, a supporting member (e.g., 360 of FIG. 6) disposed in the housing and including a first area, a second area spaced apart from the first area, and a third area connecting the first area and the second area, a conductive pattern portion (e.g., 510 of FIG. 6) disposed on the first area of the supporting member and configured to generate an electromagnetic field, an antenna (e.g., 610 of FIG. 6) disposed over the second area of the supporting member and including a circuit board and a patch-type conductive portion disposed on one surface of the circuit board, and a heat dissipation member including a first heat dissipation portion disposed under the conductive pattern portion, a second heat dissipation portion disposed under the antenna, and a third heat dissipation portion connecting the first heat dissipation portion and the second heat dissipation portion and positioned along the third area.

According to various embodiments, the second heat dissipation portion of the heat dissipation member may be configured as a ground surface of the antenna.

According to various embodiments, the third heat dissipation portion may include a fourth heat dissipation portion (e.g., 542 of FIG. 6) made of the same material as the first heat dissipation portion and a fifth heat dissipation portion (e.g., 612 of FIG. 6) made of the same material as the second heat dissipation portion and different from the first heat dissipation portion.

According to various embodiments, the electronic device may further comprise a conductive adhesive disposed between the fourth heat dissipation portion and the fifth heat dissipation portion of the heat dissipation member to adhere the fourth heat dissipation portion and the fifth heat dissipation portion and to provide a heat transfer path.

According to various embodiments, the electronic device may further comprise a main circuit board disposed under the heat dissipation member, in the housing and an electric component disposed on the main circuit board and disposed to at least partially overlap at least a portion of the antenna. Heat generated from the electric component may be transferred through the second heat dissipation portion and the third heat dissipation portion to the first heat dissipation portion.

It is apparent to one of ordinary skill in the art that the electronic device including a heat dissipation structure according to various embodiments of the present invention as described above are not limited to the above-described embodiments and those shown in the drawings, and various changes, modifications, or alterations may be made thereto without departing from the scope of the present invention.

What is claimed is:

1. An electronic device comprising:
a housing including a front plate and a rear plate;
a non-conductive supporting member disposed in the housing to be adjacent to the rear plate, the supporting member including a first area, a second area spaced apart from the first area, and a third area connecting the first area and the second area;
a conductive pattern portion disposed over the first area of the supporting member and configured to generate a magnetic field;
a heat dissipation member disposed to at least partially overlap the conductive pattern portion; and
an antenna including a circuit board, a conductive portion disposed on one surface of the circuit board, and a ground portion disposed on the other surface of the circuit board,
wherein the conductive portion of the antenna is disposed over the second area, and
wherein the heat dissipation member extends from the first area to the third area, and the ground portion of the antenna extends from the second area to the third area to contact at least a portion of the heat dissipation member.

2. The electronic device of claim 1, wherein the heat dissipation member and the ground portion are integrally formed.

3. The electronic device of claim 1, further comprising:
a main circuit board disposed between the supporting member and the front plate, in the housing; and
an electric component disposed on the main circuit board and disposed to at least partially overlap the second area of the supporting member.

4. The electronic device of claim 3, wherein the heat dissipation member and the ground portion provide a path through which heat generated from the electric component is diffused through the ground portion to the heat dissipation member.

5. The electronic device of claim 2, wherein the conductive portion of the antenna is a patch type and implements an ultra-wide band (UWB) antenna.

6. The electronic device of claim 1, further comprising a shielding member disposed between the conductive pattern portion and the heat dissipation member.

7. The electronic device of claim 6, wherein the heat dissipation member is flexible and includes a first heat dissipation portion disposed to face the shielding member and a second heat dissipation portion extending to the antenna, and
wherein the second heat dissipation portion includes a 2-1th heat dissipation portion extending from an end of the first heat dissipation portion and at least partially spaced apart from the third area of the supporting member and a 2-2th heat dissipation portion extending from the 2-1th heat dissipation portion and formed to overlap one area of the ground portion.

8. The electronic device of claim 7, further comprising a conductive adhesive disposed between the 2-2th heat dissipation portion of the heat dissipation member and the one area of the ground portion to adhere the 2-2th heat dissipation portion and the one area of the ground portion and to provide a heat transfer path.

9. The electronic device of claim 7, wherein the heat dissipation member includes at least one high-thermal conductance material, wherein the at least one high-thermal conductance material includes at least one of graphite, a carbon nanotube, a natural regenerated material, silicone, silicon, or a copper foil.

10. The electronic device of claim 1, wherein the conductive pattern portion includes a conductive pattern configured to generate a magnetic field and a base member disposed parallel to at least a portion of the front plate and/or the rear plate.

11. The electronic device of claim 10, wherein the conductive pattern is an antenna for wireless charging including a plurality of turns substantially parallel to one surface of the rear plate and/or the front plate.

12. The electronic device of claim 1, further comprising a first elastic member disposed between the rear plate and the conductive pattern portion to absorb an impact applied to the conductive pattern portion.

13. The electronic device of claim 1, further comprising a second elastic member disposed between the rear plate and the antenna to absorb an impact applied to the antenna.

14. The electronic device of claim 1, further comprising:
a main circuit board disposed between the supporting member and the front plate, in the housing; and
an electric component disposed on the main circuit board and disposed to at least partially overlap at least a portion of the antenna,
wherein the third area of the supporting member includes an opened structure, and wherein at least a portion of the heat dissipation member is disposed to pass through the opened structure.

15. The electronic device of claim 14, wherein a first heat dissipation portion of the heat dissipation member is disposed on one surface facing in a first direction of the supporting member, in the first area, and a second heat dissipation portion of the heat dissipation member is disposed on one surface facing in a second direction, opposite to the first direction of the supporting member, in the second area to be disposed adjacent to the electric component.

16. An electronic device comprising:
a housing including a plate;
a supporting member disposed in the housing and including a first area, a second area spaced apart from the first area, and a third area connecting the first area and the second area;
a conductive pattern portion disposed over the first area of the supporting member and configured to generate a magnetic field;
an antenna disposed over the second area of the supporting member and including a circuit board and a patch-type conductive portion disposed on one surface of the circuit board; and
a heat dissipation member including a first heat dissipation portion disposed under the conductive pattern portion, a second heat dissipation portion disposed under the antenna, and a third heat dissipation portion connecting the first heat dissipation portion and the second heat dissipation portion and positioned along the third area.

17. The electronic device of claim 16, wherein the second heat dissipation portion of the heat dissipation member is configured as a ground surface of the antenna.

18. The electronic device of claim 16, wherein the third heat dissipation portion includes:
a 3-1th heat dissipation portion formed of the same material as the first heat dissipation portion; and
a 3-2th heat dissipation portion formed of the same material as the second heat dissipation portion and different from the first heat dissipation portion.

19. The electronic device of claim 18, further comprising a conductive adhesive disposed between the 3-1th heat dissipation portion and the 3-2th heat dissipation portion of the heat dissipation member to adhere the 3-1th heat dissipation portion and the 3-2th heat dissipation portion and to provide a heat transfer path.

20. The electronic device of claim 16, further comprising:
a main circuit board disposed under the heat dissipation member, in the housing; and
an electric component disposed on the main circuit board and disposed to at least partially overlap at least a portion of the antenna,
wherein heat generated from the electric component is transferred through the second heat dissipation portion and the third heat dissipation portion to the first heat dissipation portion.

* * * * *